(12) United States Patent  (10) Patent No.: US 9,094,025 B1
Cheng  (45) Date of Patent: Jul. 28, 2015

(54) SYSTEMS AND METHODS OF PHASE FREQUENCY DETECTION INVOLVING FEATURES SUCH AS IMPROVED CLOCK EDGE HANDLING CIRCUITRY/ASPECTS

(71) Applicant: GSI TECHNOLOGY, INC., Sunnyvale, CA (US)

(72) Inventor: Yi-Chi Cheng, San Ramon, CA (US)

(73) Assignee: GSI TECHNOLOGY, INC., Sunnyvale, CA (US)

( * ) Notice: Subject to any disclaimer, the term of this patent is extended or adjusted under 35 U.S.C. 154(b) by 0 days.

(21) Appl. No.: 14/209,946

(22) Filed: Mar. 13, 2014

Related U.S. Application Data

(60) Provisional application No. 61/798,250, filed on Mar. 15, 2013.

(51) Int. Cl.
  *H03D 13/00* (2006.01)
  *H03L 7/093* (2006.01)
(52) U.S. Cl.
  CPC ...................................... *H03L 7/093* (2013.01)
(58) Field of Classification Search
  USPC .......................................................... 327/12
  See application file for complete search history.

(56) References Cited

U.S. PATENT DOCUMENTS

| | | | |
|---|---|---|---|
| 4,267,514 A | 5/1981 | Kimsey |
| 5,963,058 A | 10/1999 | Thomas |
| 5,977,801 A | 11/1999 | Boerstler |
| 6,157,218 A | 12/2000 | Chen |
| 6,483,389 B1 | 11/2002 | Lamb |
| 6,590,427 B2 | 7/2003 | Murphy et al. |
| 6,646,477 B1 | 11/2003 | Xin-LeBlanc |
| 6,771,096 B1 | 8/2004 | Meyers et al. |
| 6,822,484 B1 | 11/2004 | Boerstler |
| 6,924,677 B2 | 8/2005 | Lee |
| 7,003,065 B2 | 2/2006 | Homol et al. |
| 7,039,148 B1 | 5/2006 | Lamb et al. |
| 7,053,666 B2 | 5/2006 | Tak et al. |
| 7,092,475 B1 | 8/2006 | Huard |
| 7,242,256 B2 | 7/2007 | Chien |
| 7,388,408 B2 | 6/2008 | Liu et al. |
| 7,443,206 B1 | 10/2008 | Fernandez |
| 7,538,591 B2 | 5/2009 | Oh |
| 7,617,409 B2 | 11/2009 | Gilday et al. |
| 7,646,224 B2 | 1/2010 | Sundby |
| 7,733,138 B2 | 6/2010 | Uehara et al. |
| 7,750,683 B2 | 7/2010 | Huang et al. |
| 7,839,177 B1 | 11/2010 | Soh |
| 7,859,313 B2 | 12/2010 | Chien et al. |
| 7,876,871 B2 | 1/2011 | Zhang |

(Continued)

*Primary Examiner* — Daniel Puentes
(74) *Attorney, Agent, or Firm* — DLA Piper LLP (US)

(57) ABSTRACT

Systems and methods herein may include or involve control circuitry that detects missing edges of reference and/or feedback clocks and may block the next N rising edges of the feedback clock or reference clock, respectively. In some implementations, a phase frequency detector (PFD) circuit comprises first circuitry including an output that outputs a missing edge signal. The first circuitry may include components arranged to detect a missing rising edge of one or both of a reference clock signal and a feedback clock signal. Second circuitry is coupled to the first circuitry and may include components arranged to generate one or both of a reference clock blocking signal and a feedback clock blocking signal based on the missing edge signal. Further, in some implementations, the blocking of the next N rising edges of the opposite clock may effectively increase the positive gain of the PFD.

44 Claims, 8 Drawing Sheets

(56) References Cited

U.S. PATENT DOCUMENTS

| | | |
|---|---|---|
| 7,940,088 B1 | 5/2011 | Sampath et al. |
| 2002/0125961 A1 | 9/2002 | Jones et al. |
| 2008/0265957 A1 | 10/2008 | Luong et al. |
| 2009/0041173 A1 | 2/2009 | Lin |
| 2010/0156482 A1 | 6/2010 | Sundby |
| 2010/0321075 A1 | 12/2010 | Lamanna et al. |
| 2012/0133404 A1 | 5/2012 | Hsueh et al. |
| 2013/0135011 A1* | 5/2013 | Chen et al. ............ 327/12 |

* cited by examiner

PLL Block Diagram

PFD and Conceptual Model of Charge Pump

Ideal and Non-Ideal PFD Characteristic

Missing Clock Edge of Conventional PFD

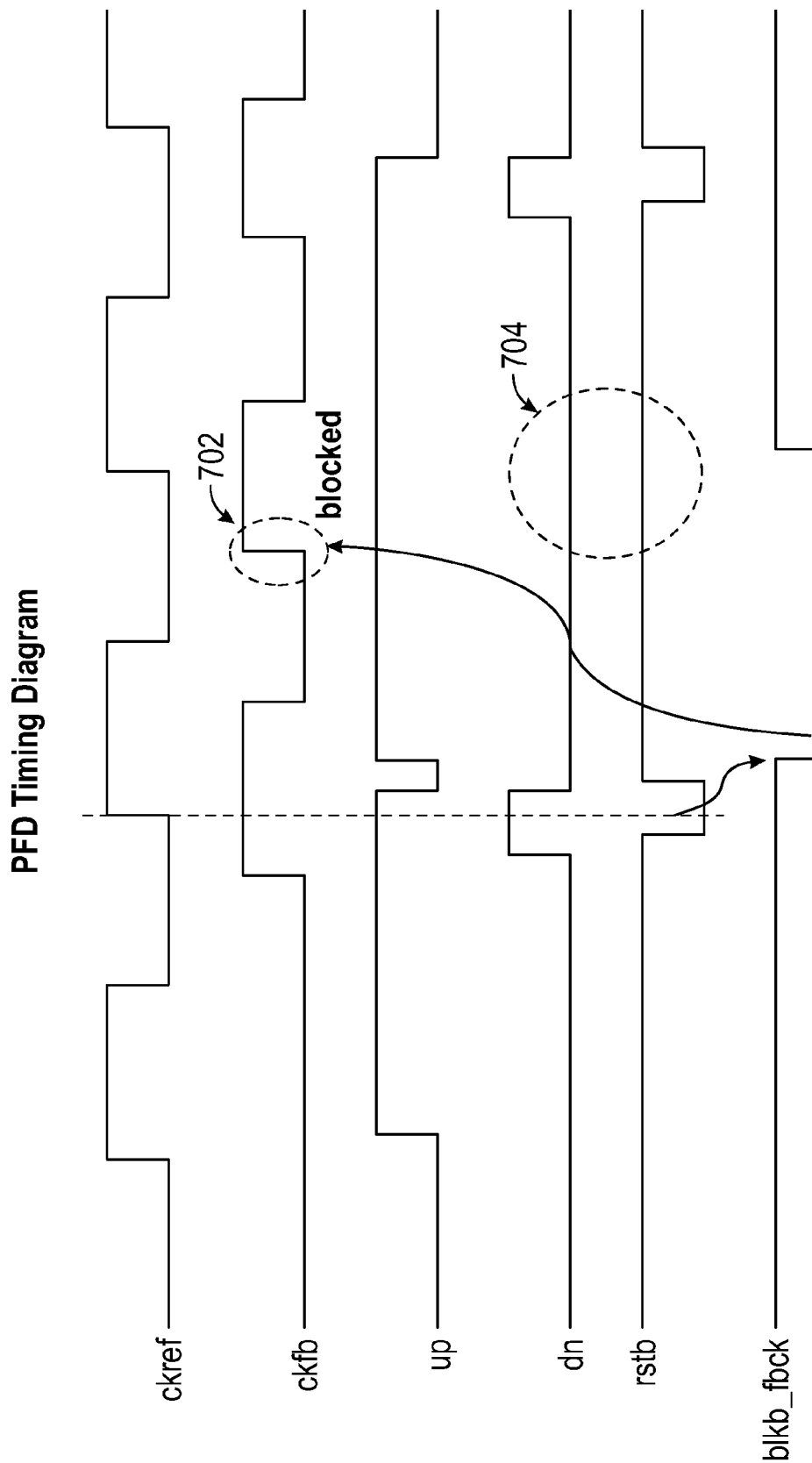

US 9,094,025 B1

SYSTEMS AND METHODS OF PHASE FREQUENCY DETECTION INVOLVING FEATURES SUCH AS IMPROVED CLOCK EDGE HANDLING CIRCUITRY/ASPECTS

CROSS-REFERENCE TO RELATED APPLICATION INFORMATION

This application claims benefit/priority of provisional application No. 61/798,250, filed Mar. 15, 2013, which is incorporated herein by reference in entirety.

BACKGROUND

1. Field

Implementations herein are directed generally to frequency detection, and aspects may involve phase frequency detection, handling missing edges of reference and/or feedback clocks, and/or increasing gain of phase frequency detectors.

2. Description of Related Information

Phase locked loop (PLL) and Delay Lock Loop (DLL) circuits are widely used in clock generation for a variety of applications including microprocessors, wireless devices, serial link transceivers, and disk drive electronics, among others. FIG. 1 illustrates a block diagram of a typical charge-pump based PLL circuit design, including a Phase Frequency Detector (PFD) 108, Charge Pump (CP) 112, Loop Filter (LPF) 116, Voltage Control Oscillator (VCO) 120, and multiple Dividers 104, 128, 124. Here, a Phase Frequency Detector (PFD) 108 is an important component in a Phase locked loops (PLL) or a Delay locked loop (DLL), such as in the PLL of FIG. 1. The Phase Frequency Detector 108 compares two clock inputs and generates UP and DOWN signals to control the Charge Pump. FIG. 2 illustrates a conventional Phase Frequency Detector PFD 200 and a conceptual charge pump 206.

In operation, a Phase Frequency Detector PFD 108 responds to the phase difference between the input reference clock (ckref) and the input feedback clock (ckfb) and generates UP and DOWN signals which switch the current in the charge-pump (CP) 112. FIG. 3 illustrates an exemplary relationship between the charge pump current Icp and the phase difference $\Delta\theta$ between the reference clock and the feedback clock, including an ideal linear PFD characteristic 302 of this relationship. Further, to avoid dead-zone issue, PFDs typically have a RESET delay path to guarantee minimum pulse width. This nonzero reset delay will reduce the linear range of the PFD to be less than $4\pi$ and causes non-ideal behavior 304 for the PFD, as shown in FIG. 3, as well as non-ideal behavior 406 (missing edge) shown in FIG. 4.

The nonzero reset delay sets a limitation for the PFD operating speed. As shown in FIG. 4, due to the nonzero reset delay, the $2^{nd}$ ckref rising edge arrives while the Reset signal (rstb) is still in effect. The rstb overrides the $2^{nd}$ ckref rising edge and thus doesn't activate the Up signal, whereas the subsequent ckfb rising edge causes the Down signal to show up first. Consequently, the phase difference (ckref−ckfb) appears as negative instead of positive.

Such gain reversal 408 may occur periodically during PLL lock-in process with conventional Phase Frequency Detector, and thus may both slow down the PLL frequency acquisition dramatically, and sometimes cause a PLL to fail in acquiring frequency lock.

FIG. 5 illustrates a general timing diagram for other existing Phase Frequency Detectors (PFDs) with features related to detection of missing edge(s). Note that there is no reversal gain, since the $2^{nd}$ ckref rising edge will trigger the $2^{nd}$ Up rising edge 502, though the $2^{nd}$ rise of the ckfb signal still generates the Down and the reset signals, and therefore limits the PD gain to be flat near $+/-2\pi$.

Overview of Some Aspects

Systems and methods herein may include or involve control circuitry that detects missing edges of reference and/or feedback clocks and blocks the next N rising edges of the feedback clock or reference clock, respectively. Further, in some implementations, blocking of the next N rising edges of the opposite clock may effectively increase the positive gain of the Phase Frequency Detector.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

DESCRIPTION OF THE DRAWINGS

The accompanying drawings, which constitute a part of this specification, illustrate various implementations and aspects of the innovations herein and, together with the description, help illustrate the principles of the present inventions. In the drawings:

FIG. 7B is a timing diagram showing exemplary operation of an illustrative phase frequency detector (PFD) circuit, consistent with certain aspects related to the innovations herein.

DETAILED DESCRIPTION OF ILLUSTRATIVE IMPLEMENTATIONS

Reference will now be made in detail to the inventions herein, examples of which are illustrated in the accompanying drawings. The implementations set forth in the following description do not represent all implementations consistent with the claimed inventions. Instead, they are merely some examples consistent with certain aspects related to the present innovations. Wherever possible, the same reference numbers will be used throughout the drawings to refer to the same or like parts.

Systems and methods herein may include or involve control circuitry that detects missing edges of reference and/or feedback clocks and generates blocking signal(s) that block the next rising edge of the feedback clock or reference clock, respectively. Further, in some implementations, the blocking of the next rising edge of the opposite clock may effectively increase the positive gain of the Phase Frequency Detector.

Figure 1:
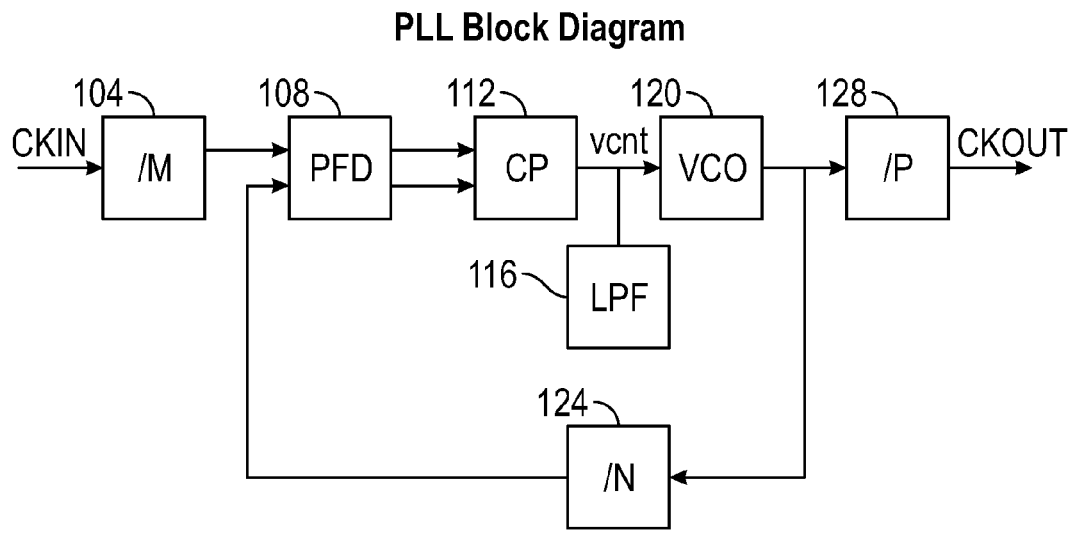
FIG. 1 is a block diagram of a conventional PLL.
Figure 2:
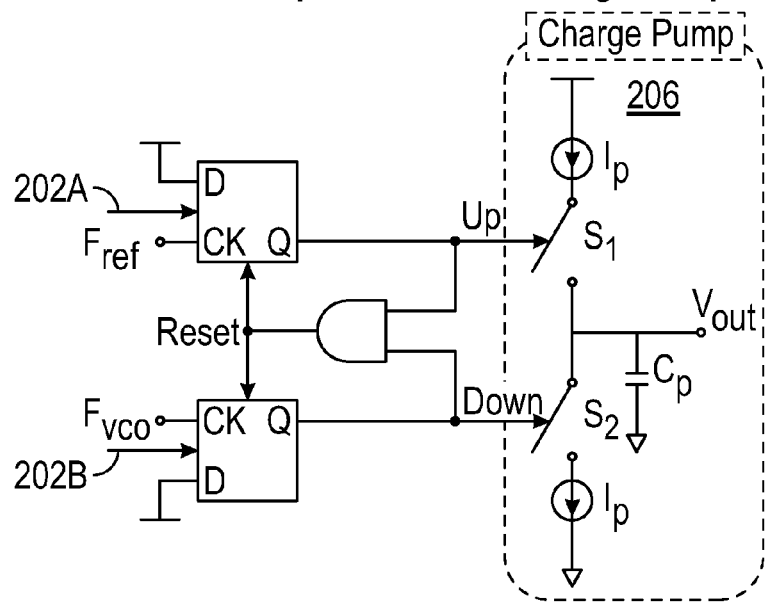
FIG. 2 is a block diagram illustrating exemplary circuitry of a conventional phase frequency detector (PFD) and a conceptual model of a charge pump.
Figure 3:
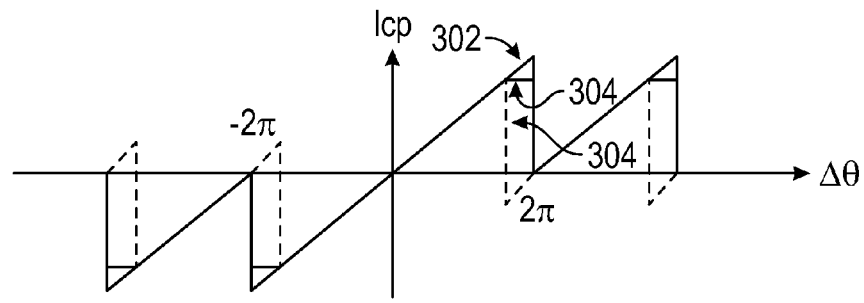
FIG. 3 is a graph illustrating exemplary relationships of charge pump current, Icp, against the frequency difference between reference and feedback clocks, showing operation of conventional and ideal circuitry.
Figure 4:
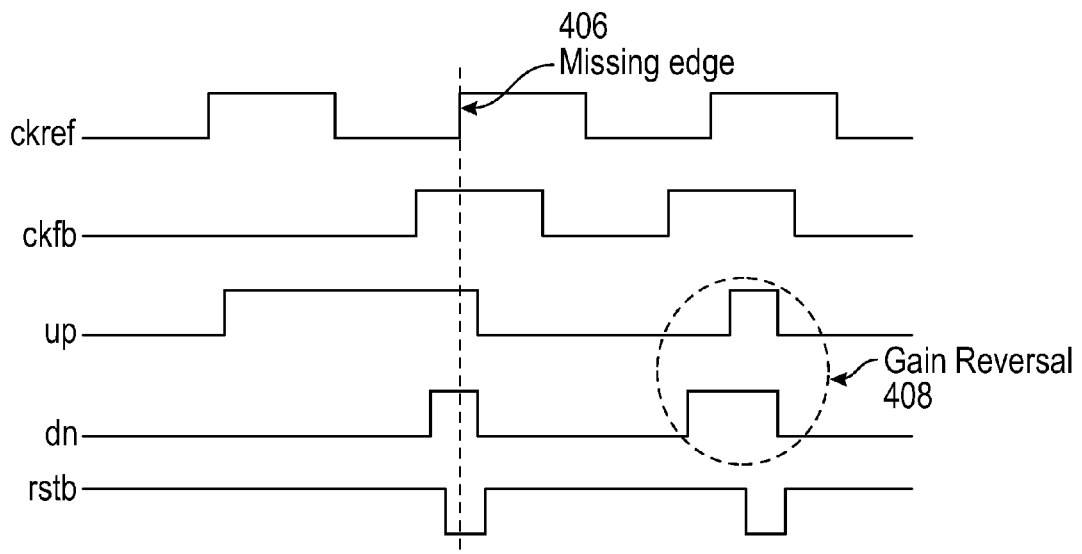
FIG. 4 is a timing diagram illustrating a missing clock edge of a conventional phase frequency difference (PFD) circuit.
Figure 5:
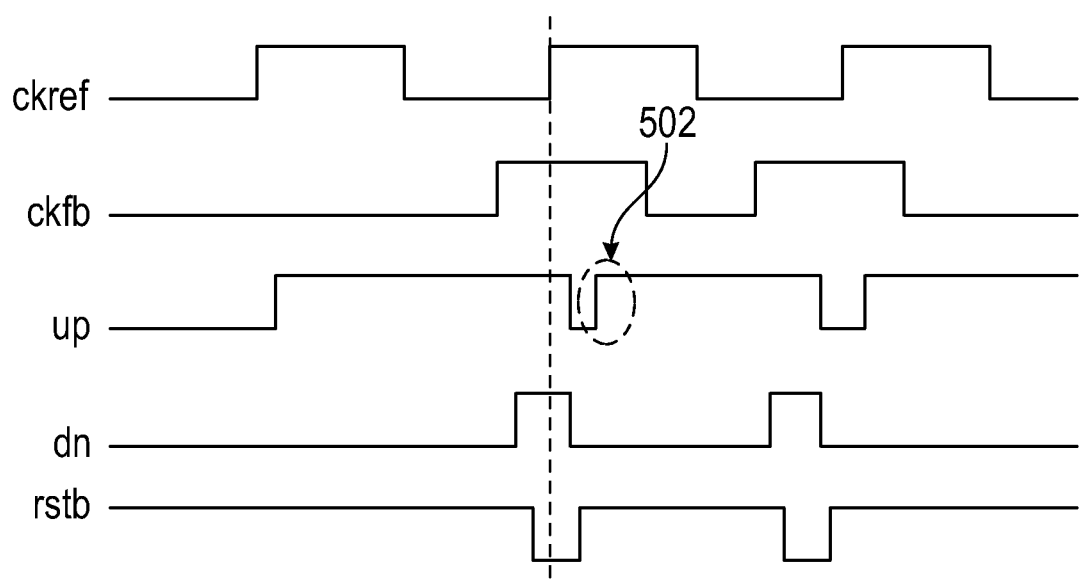
FIG. 5 is another timing diagram illustrating operation of another prior art phase frequency difference (PFD) circuit.
Figure 6:
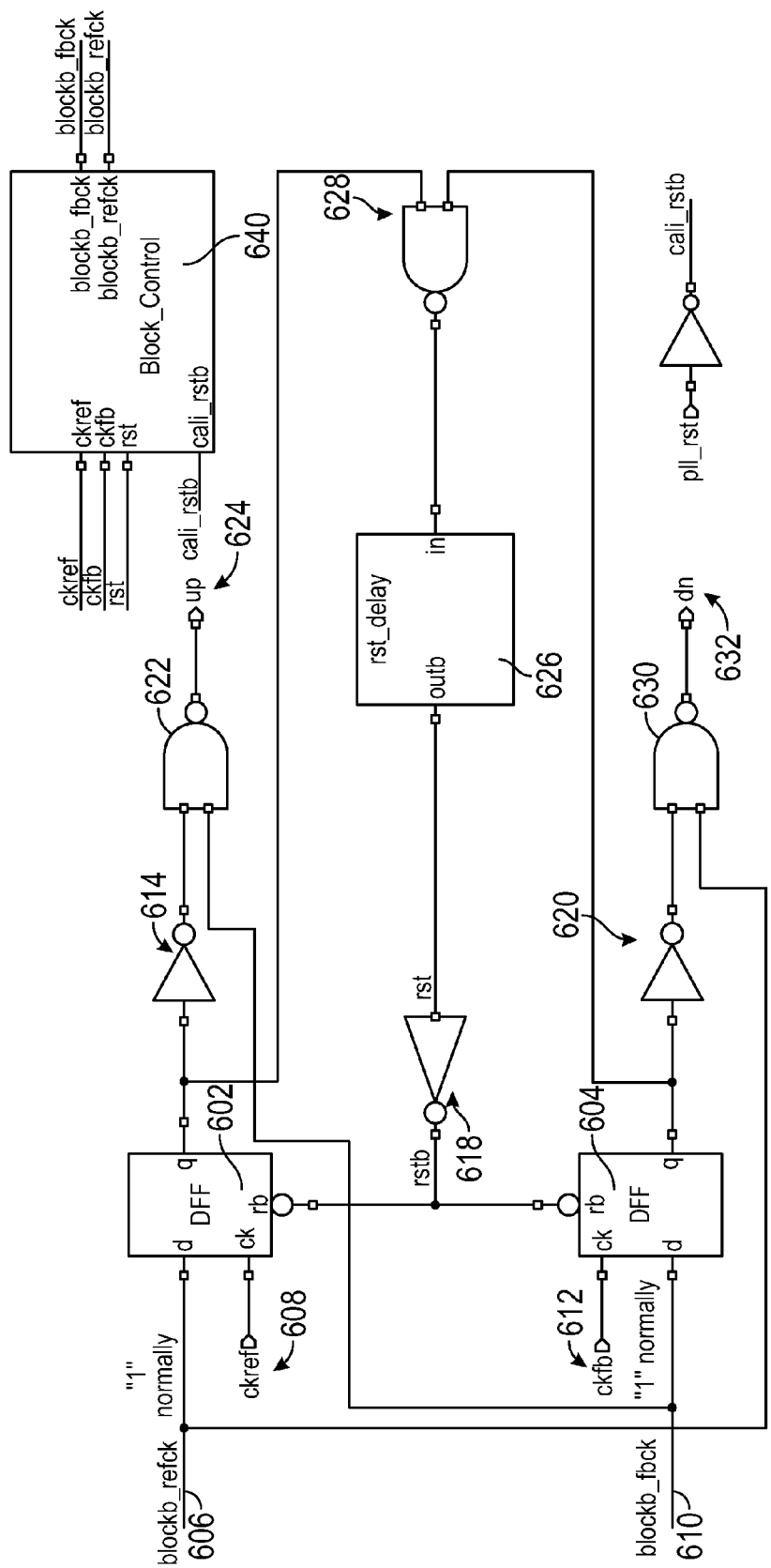
FIG. 6 is a block diagram illustrating an exemplary phase frequency detector (PFD) circuit, consistent with certain aspects related to the innovations herein.

Referring to the drawings, FIG. 6 is a block diagram illustrating an exemplary phase frequency detector (PFD) circuit, consistent with certain aspects related to the innovations herein. FIG. 6 illustrates, on the left side, input circuitry of an illustrative phase frequency detector (PFD), showing a reference clock 608 and a feedback clock 612 as inputs to first and second latches/registers of a flip flop pair 602, 604. One illustrative circuit configuration is next described, however various other arrangements are within the ambit of the present innovations. As illustrated, blocking signals that block the next rising edge of the reference clock 606 and the feedback clock 610 may be provided as D inputs to the latches/flip flops 602, 604. Here, for example, the second/lower flip flop 604 is provided, at the D input, with such blocking signal, and also provided with the feedback clock and a 'reset' signal described below. Thus, the D inputs of the register(s) are not tied to Vdd as per conventional coupling, but instead the D inputs of the flip-flops are connected to the "block_control" signals.

Moreover, implementations may be configured such that the same blocking control signal is utilized to force Up (or Down) control signal to high, and to block the other clock's rising edge. Here, for example the feedback clock blocking signal (blockb_fbck) may be utilized to force the Up signal "high", and to block the next feedback clock (ckfb) rising edge. Similarly, the reference clock blocking signal may be utilized to force the Down signal "high", and to block the next reference clock rising edge.

Turning back to the illustrative circuit design, the reference clock block signal 606 may be provided as input to a first NAND gate 630 configured to provide the down signal 632 used to control the charge pump. Similarly, the feedback clock block signal 610 may be provided as input to a second NAND gate 622 configured to provide the up signal 624 used to control the charge pump. The output of the first latch/register 602 may be coupled to this second NAND gate 622 to provide the charge pump up signal 624, and the output of the second latch/register 604 may be coupled into the first NAND gate 630 to provide the charge pump down signal 632. Further, the flip flop outputs may both be fed back through circuitry 628, 626, 618 to yield a signal that is looped back into the reset inputs of the first and second latches/registers. In operation, then, once a missing edge is detected, the blocking signal is sent to keep the respective flip flop's D input "low" to block the next rising edge of the opposite clock.

FIG. 6 illustrates, on the right side, additional circuitry of the exemplary phase frequency detector (PFD), showing the block control circuit 640 as well as other circuitry referenced above, consistent with the illustrative circuit configuration. Here, for example, the block control circuit (pfd_block_cnt) 640 may be configured to detect the missing edges of the reference clock, or of the feedback clock. Upon detection of the potential missing edge of the reference clock, the block control circuit 640 is configurable to generate a block feedback clock signal (blockb_fbck) 610 to trigger the associated latch/register 604 to block the next feedback clock (ckfb) rising edge, accordingly. Similarly, upon detection of the potential missing edge of the feedback clock, the block control circuit 640 is configurable to generate a block reference clock signal (blockb_ckref) 606 to trigger the latch/register 602 to block the next reference clock rising edge, accordingly. Further, in various implementations, the blocking of the next rising edge of the opposite clock may effectively increase the positive gain of PFD. As such, especially with respect to implementations configured for missing edge prevention together with such gain boosting features, the speed of the frequency acquisition process may be greatly enhanced.

In some implementations, a phase frequency detector (PFD) circuit comprises first circuitry coupled to a first input coupled to a reference clock line and a second input coupled to a feedback clock line and the first circuitry including an output that outputs a missing edge signal. The first circuitry receives a reference clock signal and a feedback clock signal from the first input, the first circuitry including first transistors arranged to detect a missing rising edge of one or both of the reference clock signal and the feedback clock signal. Second circuitry is coupled to the first circuitry and includes second transistors arranged to generate one or both of a reference clock blocking signal and a feedback clock blocking signal based on the missing edge signal.

Further, first latch/register circuitry includes inputs coupled to the reference clock signal and the reference clock blocking signal and an output that provides a first charge pump control signal. Second latch/register circuitry includes inputs coupled to the feedback clock signal and the feedback clock blocking signal and an output that provides a second charge pump control signal. The reference clock blocking signal is provided to circuitry that blocks a next rising edge of the reference clock signal output from the first latch/register circuitry. The feedback clock blocking signal is provided to circuitry that blocks a next rising edge of the feedback clock blocking signal output from the second latch/register circuitry.

Further, in some implementations, a first NAND gate couples to and receives the reference clock blocking signal and a second NAND gate couples to and receives the feedback clock blocking signal. A first latch/register circuitry is coupled to the second NAND gate and a second latch/register is coupled to the first NAND gate. The first NAND gate outputs a charge pump down control signal and the second NAND gate outputs a charge pump up control signal. The first NAND gate includes an output that provides the charge pump down control signal high. The second NAND gate includes an output that provides the charge pump up control signal high. The first latch/register circuitry and the second latch/register circuitry include inputs that receive a reset signal.

Moreover, in some implementations, a method for operating phase frequency detection circuitry (PFD) comprises receiving a reference clock signal and a feedback clock signal, detecting by first transistors a missing rising edge of one or both of the reference clock signal and the feedback clock signal received to output a missing edge signal, and generating by second transistors one or both of a reference clock blocking signal and a feedback clock blocking signal based on the missing edge signal.

Further, the method of operating PFD circuitry comprises coupling the reference clock signal and the reference clock blocking signal to first latch/register circuitry to output a first charge pump control signal, and coupling the feedback clock signal and the feedback clock blocking signal to second latch/register circuitry to output a second charge pump control signal.

Figure 7A:
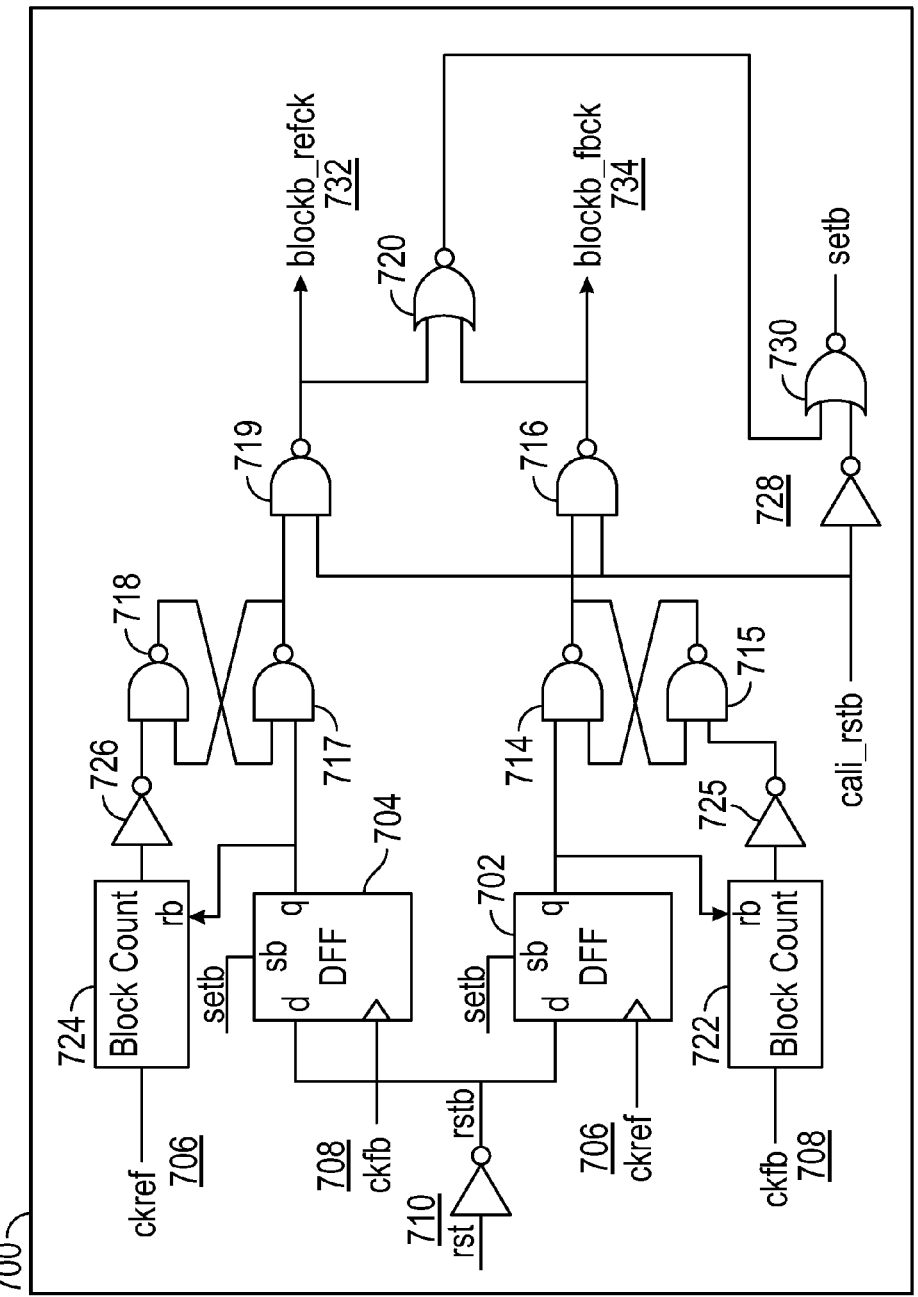
FIG. 7A is a block diagram illustrating an exemplary block control and clock edge detection circuitry, consistent with certain aspects related to the innovations herein.

FIG. 7A is a block diagram illustrating one exemplary block control and/or clock edge detection circuitry 700, consistent with certain aspects related to the innovations herein. Referring to FIG. 7A, one illustrative, more straightforward block control and clock edge detection circuitry is shown. In the illustrative implementation shown, the circuitry 700 may comprise a latch/register flip flop pair 702, 704, which may receive the reference clock 706, the feedback clock 708, and a reset signal 710 from PFD in FIG. 6A. Moreover, the circuitry 700 may comprise additional gates and/or logic 714-730 that receives the outputs from the flip flop pair and couples these outputs together with the reference clock and feedback clock to provide the reference clock blocking signal 732 and the feedback clock blocking signal 734. It is noted that, while one straightforward example of PFD block control circuitry is shown here in FIG. 7A, additional detection logic may certainly be included in further implementations, e.g., to improve the detection accuracy and extend the range of detection.

The quantity of blocked feedback clock (ckfb) rising edges and reference clock (ckref) rising edges may also be increased or it may be adjustable, e.g. from 1 to N, the block counters 722 and 724 may be configured to further speed up the acquisition process.

In some implementations, a phase frequency detector (PFD) circuit comprises first circuitry coupled to a first input coupled to a reference clock line and a second input coupled to a feedback clock line and the first circuitry including an output that outputs a missing edge signal. The first circuitry receives a reference clock signal and a feedback clock signal from the first input, the first circuitry including first transistors arranged to detect a missing rising edge of one or both of the reference clock signal and the feedback clock signal. Second circuitry is coupled to the first circuitry and includes second transistors arranged to generate one or both of a reference clock blocking signal and a feedback clock blocking signal based on the missing edge signal.

Additionally, third latch/register circuitry includes inputs that receive the reference clock signal and a reset signal. Fourth latch/register circuitry includes inputs that receive the feedback clock signal and the reset signal. The first circuitry further comprises first block counter circuitry coupled to an output of the third latch/register circuitry and including an input that receives the feedback clock signal and second block counter circuitry coupled to an output of the fourth latch/register circuitry and including an input that receives the reference clock signal.

Further, in some implementations, the phase frequency detector circuitry is coupled to charge pump circuitry, phase locked loop circuitry and delay locked loop circuitry. The PFD circuitry further comprises input circuitry including a first input coupled to a reference clock line and a second input coupled to a feedback clock line.

FIG. 7B is a timing diagram showing exemplary operation of an illustrative phase frequency detector (PFD) circuit, consistent with certain aspects related to the innovations herein. As shown in FIG. 7B, $2^{nd}$ ckfb rising edge 702 is blocked and ignored due to the blocking signal blkb_fbck, therefore the $2^{nd}$ Down (and reset) signal doesn't show up 704. Consequently, the PDF gain is increased to the maximum for the full cycle. Referring to FIG. 7B, the exemplary timing diagram depicted illustrates aspects of the present PFD inventions such as those associated with the circuitry of FIGS. 6A and 6B, and shows an exemplary situation when the signals are very far apart. In such situations, implementations herein may be configured to extend the blocking operation over 2-3 or more cycles. However, such situations are not extremely common, so the circuitry herein is configured not to extend such blocking when the signals/timing windows are close. Indeed, implementations may be configured to perform one or more of: a block single cycle operation, and/or block 2 cycles, block 3 cycles, block 4 cycles, etc. operations.

In some implementations, a phase frequency detector (PFD) circuit comprises first circuitry coupled to a first input coupled to a reference clock line and a second input coupled to a feedback clock line and the first circuitry including an output that outputs a missing edge signal. The first circuitry receives a reference clock signal and a feedback clock signal from the first input, the first circuitry including first transistors arranged to detect a missing rising edge of one or both of the reference clock signal and the feedback clock signal. Second circuitry is coupled to the first circuitry and includes second transistors arranged to generate one or both of a reference clock blocking signal and a feedback clock blocking signal based on the missing edge signal.

Further, third latch/register circuitry includes inputs that receive the reference clock signal and a reset signal. Fourth latch/register circuitry includes inputs that receive the feedback clock signal and the reset signal. The first circuitry further comprises first block counter circuitry coupled to an output of the third latch/register circuitry and including an input that receives the feedback clock signal and second block counter circuitry coupled to an output of the fourth latch/register circuitry and including an input that receives the reference clock signal.

Moreover, the first block counter circuitry and the second block counter circuitry may include transistors arranged to configure a number of blocked rising edge cycles of the reference clock signal and the feedback clock signal. The PFD circuitry includes third transistors arranged to generate, upon blocking of a subsequent feedback clock rising edge via the feedback clock blocking signal, a low charge pump down control signal and a low reset signal. The third transistors are arranged such that, upon blocking of a reference clock rising edge or a feedback clock rising edge, to increases circuit gain to maximum for a cycle. The third transistors utilize the feedback clock blocking signal and the reference clock blocking signal to block a rising edge for at least one clock cycle. The phase frequency detector circuitry increases positive gain and a speed of a frequency acquisition process based on one of the reference clock blocking signal and the feedback clock blocking signal.

Overall, the innovative phase frequency detector (PFD) innovations herein may be utilized in systems or methods involving either phase locked loops (PLL) circuitry and/or delay locked loop (DLL) circuitry. Here, considerations and implementation of PLL embodiments differ from DLL embodiments in that the phase frequency detector is required to both lock in phase as well as frequency, even though the frequency is not known. Hence, PLL configurations may include circuitry to address wider ranges of frequency, and which may require longer time periods to achieve lock.

Figure 8:
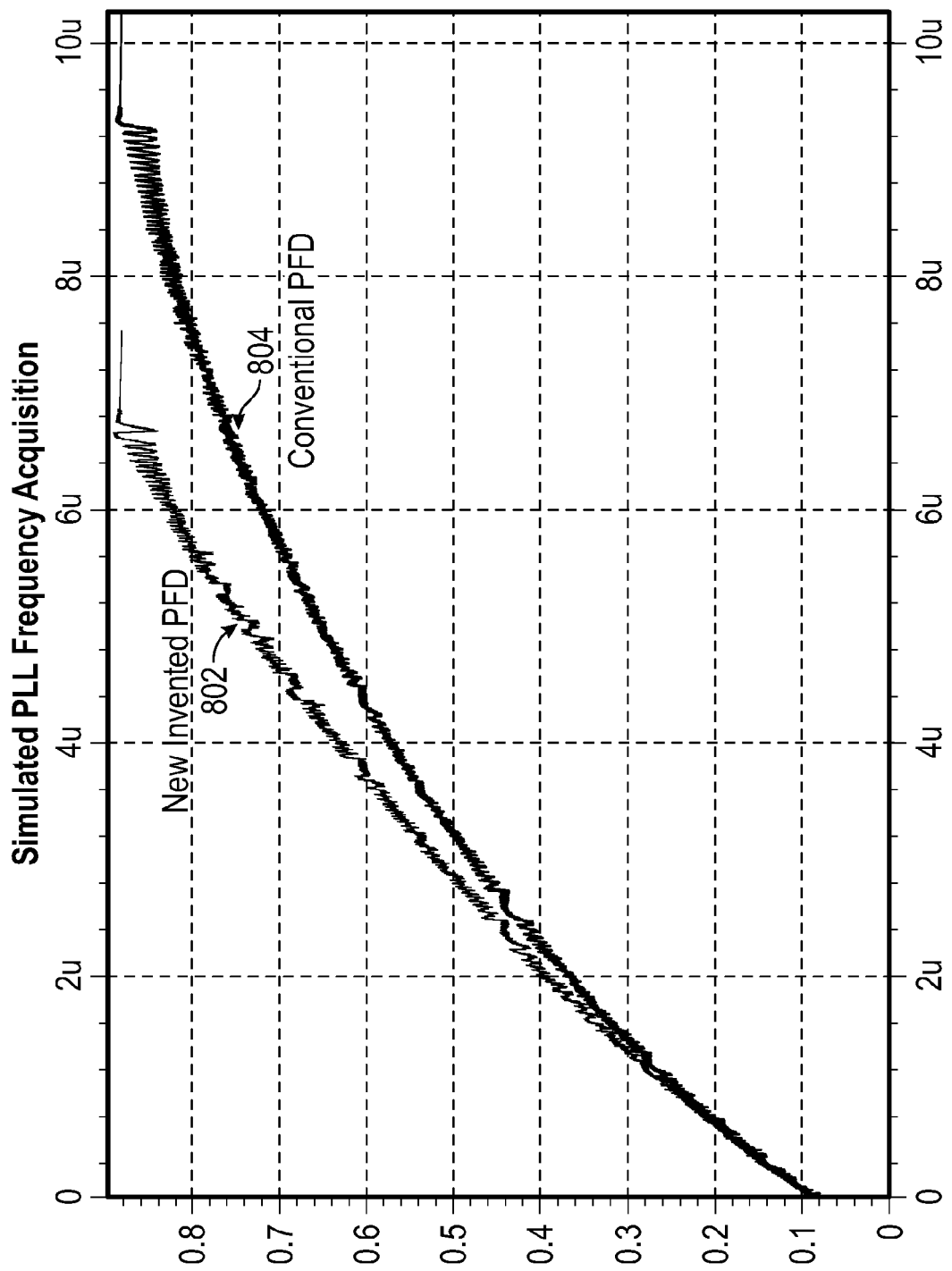
FIG. 8 is a graph showing representative relationships of frequency acquisition over time of a conventional circuit versus the present/innovative phase frequency detector (PFD) circuitry, consistent with certain aspects related to the innovations herein.

FIG. 8 is a graph showing representative relationships of frequency acquisition over time of a conventional circuit versus the present/innovative phase frequency detector (PFD) circuitry, consistent with certain aspects related to the innovations herein. As shown in FIG. 8, phase lock for the innovative phase frequency detectors herein 802 may be achieved substantially sooner than lock of comparable/conventional phase frequency detectors 804, thus acceleration of the frequency acquisition process is achieved.

Figure 9:
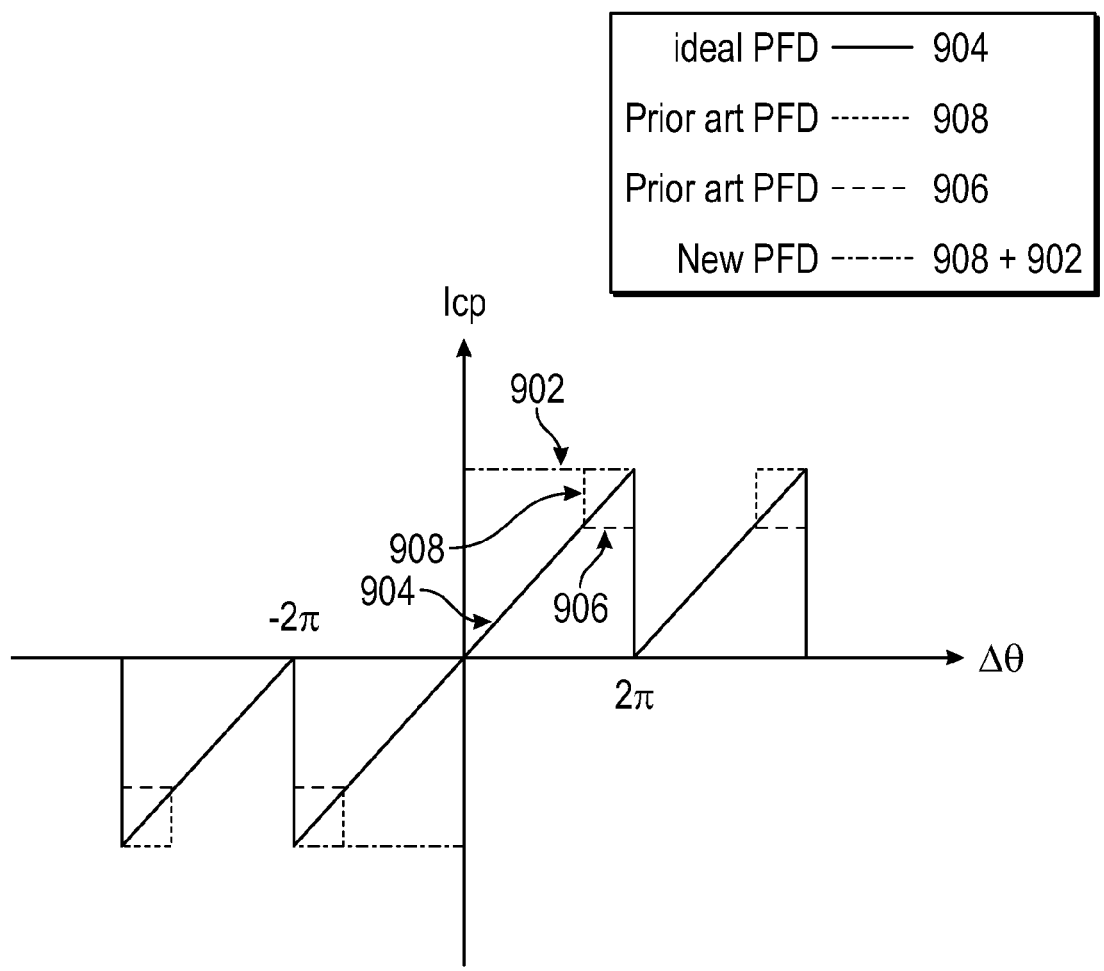
FIG. 9 is a graph illustrating exemplary relationships of charge pump current, Icp, against the frequency difference between reference and feedback clocks for innovative phase frequency detector (PFD) circuitry, consistent with certain aspects related to the innovations herein.

FIG. 9 is a graph illustrating exemplary relationships of charge pump current, Icp, against the frequency difference between reference and feedback clocks for innovative phase frequency detector (PFD) circuitry, consistent with certain aspects related to the innovations herein. FIG. 9 illustrates an exemplary transfer curve for implementations consistent with the present innovations, a combination of 902 and 908, as shown against an ideal phase frequency detector curve 904, and the transfer curve of known/existing phase frequency detectors 906 and 908.

As such, consistent with aspects of the present phase frequency detector innovations, systems and methods herein may overcome drawbacks such as the gain reversal problems associated with conventional PFDs. Here, for example, upon detection of the potential missing ckref clock edge, implementations may force the Up signal high and block the next N rising edges of the other clock (ckfb), and/or vice versa. Further, the present inventions may boost up the Phase Detector (PD) gain when the phase difference is close to +/−2π, where the potential missing edge can occur. For example, as a function of the present circuit configurations and implementations, phase frequency detectors herein may have transfer curves reaching maximum PD gain (gain-boosting) when phase error is near +/−2π, and for the next N cycles upon detection of the potential missing clock edge. As such, the associated PLL and DLL circuitry is able to move past such transition situations more quickly.

Furthermore, according to certain embodiments, the quantity of blocked clock edges can also be adjustable. Accordingly, implementations herein may speed up the PLL or DLL frequency acquisition process, such that it is faster than prior known phase frequency detectors as well as conventional PFD designs.

In addition to the above innovations and architecture, the present inventions also include, inter alia, methods of operation, methods of fabricating devices consistent with the features and/or functionality herein, products, and products produced via such processes. By way of example and not limitation, methods of fabrication herein may include known manufacturing processes such as in CMOS technologies involving aspects such as p-mos and n-mos transistor formation, multiple metallization layers and/or local interconnects, among others. A variety of exemplary/staple processes here, for example, being set forth in the backgrounds/disclosures of U.S. Pat. Nos. 4,794,561, 5,624,863, 5,994,178, 6,001,674, 6,117,754, 6,127,706, 6,417,549, 6,894,356, and 7,910,427 as well as U.S. patent application publication No. US2007/0287239A1, which are incorporated herein by reference.

As disclosed herein, features consistent with the present inventions may be utilized via and/or involved with various circuits/circuitry, hardware, software and/or firmware. For example, the systems and methods disclosed herein may be embodied in or used in connection with various forms including, for example, memory, data processors, such as in computing devices that also includes memory, a database, digital electronic circuitry, firmware, software, or in combinations of them. Further, while some of the disclosed implementations describe specific hardware components, systems and methods consistent with the innovations herein may be implemented in the context of any combination of hardware, software and/or firmware. Moreover, the above-noted features and other aspects and principles of the innovations herein may be implemented in various memory environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data/instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media), though does not include transitory media such as carrier waves.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the inventions pertain that variations and modifications of the various implementations shown and described herein may be made without departing from the spirit and scope of the innovations herein. Accordingly, it is intended that the inventions be limited only to the extent required by the applicable rules of law.

The invention claimed is:

1. Phase frequency detector (PFD) circuitry comprising:
   inputs that receive a reference clock signal and a feedback clock signal;
   first transistors arranged to detect a missing rising edge of one or both of the reference clock signal and the feedback clock signal received by the inputs, and output a missing edge signal;
   second transistors arranged to generate one or both of a reference clock blocking signal and a feedback clock blocking signal based on the missing edge signal;
   first flip-flop circuitry including inputs coupled to the reference clock signal and the reference clock blocking signal, and an output that provides a first charge pump control signal;
   second flop-flop circuitry including inputs coupled to the feedback clock signal and the feedback clock blocking signal and an output that provides a second charge pump control signal;
   wherein the reference clock blocking signal and the feedback clock blocking signal are coupled to D inputs of the first flip-flop circuitry and the second flip-flop circuitry, respectively.

2. The PFD circuitry of claim 1, wherein the reference clock blocking signal is provided to circuitry that blocks a next rising edge of the reference clock signal output from the first flip-flop circuitry; and
   wherein the feedback clock blocking signal is provided to circuitry that blocks a next rising edge of the feedback clock blocking signal output from the second flip-flop circuitry.

3. The PFD circuitry of claim 1, further comprising:
   third flip-flop circuitry including inputs that receive the reference clock signal and a reset signal; and
   fourth flip-flop circuitry including inputs that receive the feedback clock signal and the reset signal.

4. The PFD circuitry of claim 3, wherein the reference clock blocking signal is coupled to a D input of a flip-flop of the first flip-flop circuitry.

5. The PFD circuitry of claim 3, wherein the feedback clock blocking signal is coupled to a D input of a flip-flop of the second flip-flop circuitry.

6. The PFD circuitry of claim 3, wherein the first circuitry further comprises:
   second block counter circuitry coupled to an output of the fourth flip-flop circuitry and including an input that receives the reference clock signal.

7. The PFD circuitry of claim 6, wherein the first block counter circuitry and the second block counter circuitry include transistors that process a number of blocked rising edge cycles of the reference clock signal and the feedback clock signal.

8. The PFD circuitry of claim 1, wherein the first circuitry further comprises:
   first block counter circuitry coupled to an output of the third flip-flop circuitry and including an input that receives the feedback clock signal.

9. The PFD circuitry of claim 1, wherein the phase frequency detector circuitry increases positive gain based on one of the reference clock blocking signal and the feedback clock blocking signal.

10. The PFD circuitry of claim 1, wherein the phase frequency detector circuitry increases a frequency acquisition process based on one of the reference clock blocking signal and the feedback clock blocking signal.

11. Phase frequency detector (PFD) circuitry comprising:
    inputs that receive a reference clock signal and a feedback clock signal;
    first transistors arranged to detect a missing rising edge of one or both of the reference clock signal and the feedback clock signal received by the input, and output a missing edge signal;
    second transistors arranged to generate one or both of a reference clock blocking signal and a feedback clock blocking signal based on the missing edge signal;
    a first NAND gate coupled to and receiving the reference clock blocking signal and a second NAND gate coupled to and receiving the feedback clock blocking signal.

12. The PFD circuitry of claim 11, wherein first flip-flop circuitry is coupled to the second NAND gate and second flip-flop circuitry is coupled to the first NAND gate.

13. The PFD circuitry of claim 11, wherein the first NAND gate outputs a charge pump down control signal and the second NAND gate outputs a charge pump up control signal.

14. The PFD circuitry of claim 13, wherein the first NAND gate includes an output that provides the charge pump down control signal high; and
    wherein the second NAND gate includes an output that provides the charge pump up control signal high.

15. The PFD circuitry of claim 11, further comprising:
    first circuitry including at least one flip-flop, latch or register, and inputs coupled to the reference clock signal and the reference clock blocking signal and an output that provides a first charge pump control signal;
    second circuitry including at least one flip-flop, latch or register, inputs coupled to the feedback clock signal and the feedback clock blocking signal and an output that provides a second charge pump control signal.

16. The PFD circuitry of claim 15, wherein the reference clock blocking signal is provided to circuitry that blocks a next rising edge of the reference clock signal output from the first circuitry; and
    wherein the feedback clock blocking signal is provided to circuitry that blocks a next rising edge of the feedback clock blocking signal output from the second circuitry.

17. The PFD circuitry of claim 15, wherein the reference clock blocking signal is coupled to a D input of a flip-flop of the first circuitry, and the feedback clock blocking signal is coupled to a D input of a flip-flop of the second circuitry.

18. The PFD circuitry of claim 17, wherein the first circuitry further comprises:
    second block counter circuitry coupled to an output of the fourth circuitry and including an input that receives the reference clock signal.

19. The PFD circuitry of claim 18, wherein the first block counter circuitry and the second block counter circuitry include transistors that process a number of blocked edge cycles of the reference clock signal and the feedback clock signal.

20. The PFD circuitry of claim 17, wherein the phase frequency detector circuitry increases positive gain based on one of the reference clock blocking signal and the feedback clock blocking signal.

21. The PFD circuitry of claim 17, wherein the phase frequency detector circuitry increases a speed of a frequency acquisition process based on one of the reference clock blocking signal and the feedback clock blocking signal.

22. The PFD circuitry of claim 17, wherein the reference clock blocking signal is provided to circuitry that blocks a next rising edge of the reference clock signal output from the first circuitry; and wherein the feedback clock blocking signal is provided to circuitry that blocks a next rising edge of the feedback clock blocking signal output from the second circuitry.

23. Phase frequency detector (PFD) circuitry comprising:
first circuitry comprising a first input coupled to a reference clock line providing a reference clock signal, a second input coupled to a feedback clock line providing a feedback clock signal, and an output that outputs a missing edge signal, the first circuitry having first transistors arranged to detect a missing edge of one or both of the reference clock signal and the feedback clock signal and produce the missing edge signal;
second circuitry coupled to the first circuitry and including second transistors arranged to generate one or both of a reference clock blocking signal and a feedback clock blocking signal based on the missing edge signal;
third circuitry, within or coupled to the first circuitry, including at least one flip-flop and inputs that receive the reference clock signal and a reset signal; and
fourth circuitry, within or coupled to the first circuitry, including at least one flip-flop and inputs that receive the feedback clock signal and the reset signal;
wherein the first circuitry includes first block counter circuitry coupled to an output of the third circuitry and including an input that receives the feedback clock signal.

24. The PFD circuitry of claim 23, further comprising:
first flip-flop circuitry including inputs coupled to the reference clock signal and the reference clock blocking signal and an output that provides a first charge pump control signal;
second flip-flop circuitry including inputs coupled to the feedback clock signal and the feedback clock blocking signal and an output that provides a second charge pump control signal.

25. The PFD circuitry of claim 24, wherein the reference clock blocking signal is provided to circuitry that blocks a next rising edge of the reference clock signal output from the first flip-flop circuitry; and
wherein the feedback clock blocking signal is provided to circuitry that blocks a next rising edge of the feedback clock blocking signal output from the second flip-flop circuitry.

26. The PFD circuitry of claim 24, wherein the reference clock blocking signal is coupled to a D input of a first flip-flop of the first flip-flop circuitry, and the feedback clock blocking signal is coupled to a D input of a second flip-flop of the second flip-flop circuitry.

27. The PFD circuitry of claim 26, wherein the phase frequency detector circuitry increases positive gain and/or a speed of a frequency acquisition process based on one of the reference clock blocking signal and the feedback clock blocking signal.

28. The PFD circuitry of claim 26, wherein the first circuitry further comprises:
second block counter circuitry coupled to an output of the fourth circuitry and including an input that receives the reference clock signal.

29. The PFD circuitry of claim 28, wherein the first block counter circuitry and the second block counter circuitry include transistors that process a number of blocked edge cycles of the reference clock signal and the feedback clock signal.

30. The PFD circuitry of claim 29, wherein the PFD circuitry includes third transistors arranged to generate, upon blocking of a subsequent feedback clock edge via the feedback clock blocking signal, a low charge pump down control signal and/or a low reset signal.

31. The PFD circuitry of claim 30, wherein the third transistors are arranged, upon blocking of a reference clock edge or a feedback clock edge, such that circuit gain is increased to maximum for a cycle.

32. The PFD circuitry of claim 29, wherein the third transistors utilize the feedback clock blocking signal and the reference clock blocking signal to block an edge for at least one clock cycle.

33. The PFD circuitry of claim 24, wherein the reference clock blocking signal is coupled to a D input of a first flip-flop of the first flip-flop circuitry, and the feedback clock blocking signal is coupled to a D input of a second flip-flop of the second flip-flop circuitry.

34. The PFD circuitry of claim 33, wherein the first circuitry further comprises:
second block counter circuitry coupled to an output of the fourth circuitry and including an input that receives the reference clock signal.

35. The PFD circuitry of claim 34, wherein the first block counter circuitry and the second block counter circuitry include transistors that process a number of blocked edge cycles of the reference clock signal and the feedback clock signal.

36. The PFD circuitry of claim 33, wherein the phase frequency detector circuitry increases positive gain based on one of the reference clock blocking signal and the feedback clock blocking signal.

37. The PFD circuitry of claim 33, wherein the phase frequency detector circuitry increases a speed of a frequency acquisition process based on one of the reference clock blocking signal and the feedback clock blocking signal.

38. The PFD circuitry of claim 33, wherein the reference clock blocking signal is provided to circuitry that blocks a next rising edge of the reference clock signal output from the first flip-flop circuitry; and
wherein the feedback clock blocking signal is provided to circuitry that blocks a next rising edge of the feedback clock blocking signal output from the second flip-flop circuitry.

39. The PFD circuitry of claim 23, wherein the first circuitry further comprises:
second block counter circuitry coupled to an output of the fourth circuitry and including an input that receives the reference clock signal.

40. The PFD circuitry of claim 39, wherein the first block counter circuitry and the second block counter circuitry provide a count of clock cycles that is used in determining a duration of the reference clock blocking signal and/or the feedback clock blocking signal.

41. The PFD circuitry of claim 40, wherein the third transistors utilize the feedback clock blocking signal and the reference clock blocking signal to block a rising edge for at least one clock cycle.

42. The PFD circuitry of claim 40, wherein the PFD circuitry includes third transistors arranged to generate, upon blocking of a subsequent feedback clock rising edge via the feedback clock blocking signal, a low charge pump down control signal and/or a low reset signal.

43. The PFD circuitry of claim 42, wherein the third transistors are arranged such that, upon blocking of a reference clock rising edge or a feedback clock rising edge, to increases circuit gain to maximum for a cycle.

44. The PFD circuitry of claim 23, wherein the phase frequency detector circuitry increases positive gain and/or a speed of a frequency acquisition process based on one of the reference clock blocking signal and the feedback clock blocking signal.

* * * * *